(12) United States Patent
Kim et al.

(10) Patent No.: US 12,155,743 B2
(45) Date of Patent: Nov. 26, 2024

(54) CLOCK DATA RECOVERY CIRCUIT AND APPARATUS INCLUDING THE SAME

(71) Applicant: Samsung Electronics Co., Ltd., Suwon-si (KR)

(72) Inventors: Sunggeun Kim, Hwaseong-si (KR); Nakwon Lee, Seoul (KR); Jaehyun Park, Seoul (KR); Kyeongjoon Ko, Yongin-si (KR); Kangjik Kim, Hwaseong-si (KR); Seuk Son, Suwon-si (KR); Byunghyun Lim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 13 days.

(21) Appl. No.: 17/957,414

(22) Filed: Sep. 30, 2022

(65) Prior Publication Data

US 2023/0114988 A1 Apr. 13, 2023

(30) Foreign Application Priority Data

Oct. 1, 2021 (KR) .......................... 10-2021-0131138

(51) Int. Cl.
*H04L 7/00* (2006.01)
(52) U.S. Cl.
CPC .................................. *H04L 7/0025* (2013.01)
(58) Field of Classification Search
CPC ..................................................... H04L 7/0025
See application file for complete search history.

(56) References Cited

U.S. PATENT DOCUMENTS

| | | | |
|---|---|---|---|
| 7,363,563 B1 * | 4/2008 | Hissen | H04L 1/243 |
| | | | 327/144 |
| 7,928,788 B2 | 4/2011 | Jiang | |
| 8,050,372 B2 | 11/2011 | Lee | |
| 8,184,029 B1 | 5/2012 | Hsieh et al. | |
| 9,208,130 B1 | 12/2015 | Chen | |
| 9,225,324 B2 | 12/2015 | Arcudia et al. | |
| 9,485,084 B2 | 11/2016 | Sun et al. | |
| 9,608,611 B1 | 3/2017 | Hearne et al. | |
| 9,698,968 B2 | 7/2017 | Bonaccio et al. | |
| 10,075,174 B1 | 9/2018 | Bucossi et al. | |
| 10,237,052 B1 | 3/2019 | Moscone | |
| 11,849,015 B1 * | 12/2023 | Zhao | H04L 7/0025 |

* cited by examiner

*Primary Examiner* — Janice N Tieu
(74) *Attorney, Agent, or Firm* — Harness, Dickey & Pierce, P.L.C.

(57) ABSTRACT

A clock data recovery circuit includes an inphase-quadrature (I-Q) merged phase interpolator circuit configured to generate a first clock pair and a second clock pair from a plurality of reference clock signals, the plurality of reference clock signals having different phases, the first clock pair comprising an I clock signal and an inverted I clock signal, and the second clock pair comprising a Q clock signal and an inverted Q clock signal, a sampler circuit configured to sample input data based on the first clock pair and the second clock pair, and a control circuit configured to control phases of the first clock pair and the second clock pair, the controlling including providing a control signal to the I-Q merged phase interpolator circuit based on a sampling result of the sampler circuit, the I-Q merged phase interpolator circuit is configured to share analog inputs based on the control signal.

10 Claims, 11 Drawing Sheets

CLOCK DATA RECOVERY CIRCUIT AND APPARATUS INCLUDING THE SAME

CROSS-REFERENCE TO RELATED APPLICATION

This U.S. non-provisional application is based on and claims the benefit of priority under 35 U.S.C. § 119 to Korean Patent Application No. 10-2021-0131138, filed on Oct. 1, 2021, in the Korean Intellectual Property Office, the disclosure of which is incorporated by reference herein in its entirety.

BACKGROUND

Various example embodiments of the inventive concepts relate to a clock data recovery circuit for recovering a clock and data from serial data, and more particularly, to a clock data recovery circuit, an apparatus including the same, a system including the same, and/or a method of operating the same, etc.

A serial communication method may be used to transmit data at high speed. The serial communication method may be used in various applications, such as communication between components included in a system as well as communication between independent devices through detachable ports, and data movement (e.g., data transmission) in an integrated circuit.

A clock data recovery circuit which detects a phase of a clock embedded in serial data to generate recovery clocks from the serial data, and generates recovery data from the serial data using the recovery clocks may be used in various devices and applications that transmit and receive data using a serial communication method.

Meanwhile, the recovery clocks may include an inphase (I) clock and a quadrature (Q) clock, and the I clock and Q clock may be used to sample serial data. Due to the structural limitations of the clock data recovery circuit of the related art, unexpected skew may occur between the I clock and the Q clock in a process of recovering the I clock and the Q clock from the serial data, which causes deterioration of the quality of the recovery data and/or causes the recovery data to be inaccurate, etc.

SUMMARY

Various example embodiments of the inventive concepts provide a clock data recovery circuit that decreases, reduces, and/or prevents skew between an inphase (I) clock and a quadrature (Q) clock, and generates high-quality recovery data using the I clock and the Q clock, an apparatus including the clock data recovery circuit, a system including the clock data recovery circuit, and/or a method for operating the clock data recovery circuit, etc.

According to at least one example embodiment of the inventive concepts, there is provided a clock data recovery circuit including an inphase-quadrature (I-Q) merged phase interpolator circuit configured to generate a first clock pair and a second clock pair from a plurality of reference clock signals, the plurality of reference clock signals having different phases, the first clock pair comprising an I clock signal and an inverted I clock signal, and the second clock pair comprising a Q clock signal and an inverted Q clock signal, a sampler circuit configured to sample input data based on the first clock pair and the second clock pair, and a control circuit configured to control phases of the first clock pair and the second clock pair, the controlling including providing a control signal to the I-Q merged phase interpolator circuit based on a sampling result of the sampler circuit, wherein the I-Q merged phase interpolator circuit is further configured to share analog inputs based on the control signal.

According to at least one example embodiment of the inventive concepts, there is provided an apparatus including a receiving circuit; and a transmitting circuit configured to transmit input data to the receiving circuit through a channel, wherein the receiving circuit comprises a clock data recovery circuit comprising an inphase-quadrature (I-Q) merged phase interpolator circuit, the I-Q merged phase interpolator circuit is configured to, generate analog inputs based on a phase interpolation code, and receive the analog inputs to generate an I clock signal, an inverted I clock signal, a Q clock signal, and an inverted Q clock signal.

According to at least one example embodiment of the inventive concepts, there is provided an apparatus including a receiving circuit; and a transmitting circuit configured to transmit input data to the receiving circuit through a channel, wherein the receiving circuit comprises a clock data recovery circuit configured to, generate the phase interpolation code from a control signal, generate a plurality of analog inputs based on the phase interpolation code, and generate sampling clock signals based on the plurality of analog inputs.

BRIEF DESCRIPTION OF THE DRAWINGS

Various example embodiments of the inventive concepts will be more clearly understood from the following detailed description taken in conjunction with the accompanying drawings in which.

DETAILED DESCRIPTION

Figure 1A:
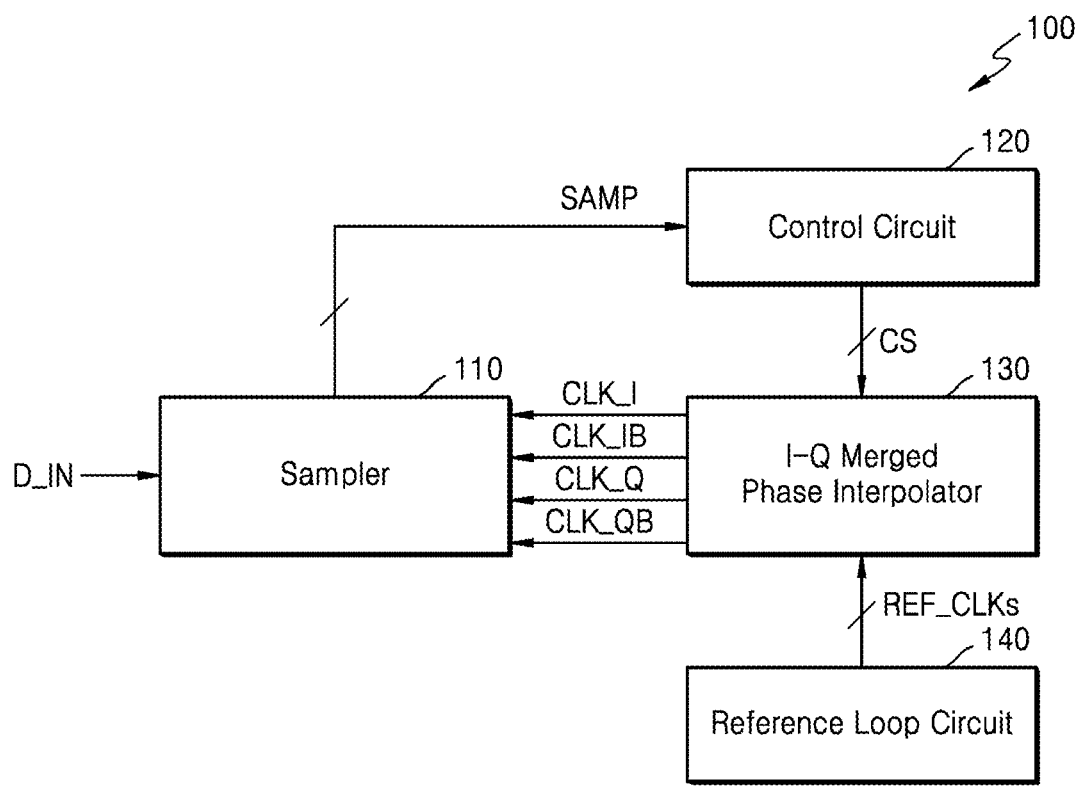
FIG. 1A is a block diagram illustrating a clock data recovery circuit according to at least one example embodiment of the inventive concepts.

Hereinafter, various example embodiments of the inventive concepts will be described in detail by referring to the attached drawings. The same reference numerals are used for the same components in the drawings, and repeated descriptions thereof are omitted.

Figure 1B:
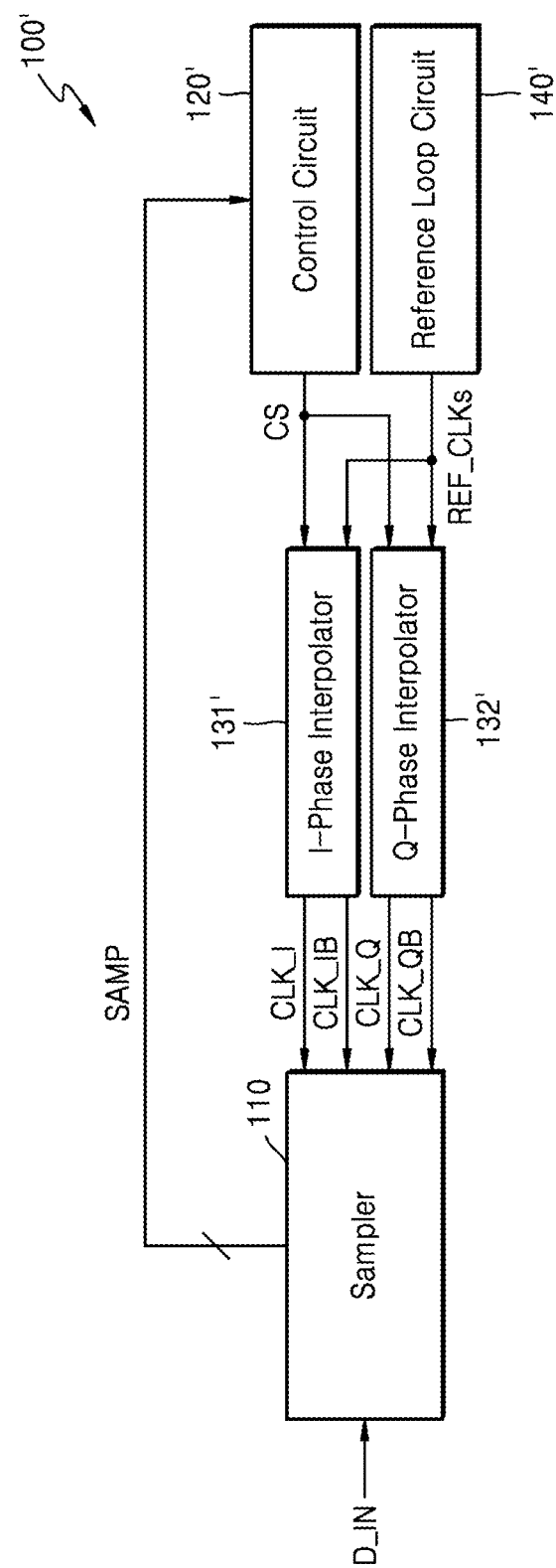
FIG. 1B is a block diagram illustrating a clock data recovery circuit according to a comparative example.

FIG. 1A is a block diagram illustrating a clock data recovery circuit 100 according to at least one example embodiment of the inventive concepts, and FIG. 1B is a block diagram illustrating a clock data recovery circuit 100' according to a comparative example. In some example embodiments, the clock data recovery circuit 100 may be manufactured using a semiconductor process and may be included in any semiconductor device, etc. In addition, the clock data recovery circuit 100 may be included in a receiving circuit (and/or a receiver) that receives data in a serial communication method (e.g., receives data serially, etc.). The clock data recovery circuit 100 may receive input data D_IN transmitted by a transmitting circuit (e.g., a transmitter) through serial communication. The clock data recovery circuit 100 may generate recovery clocks from the input data D_IN, sample the input data D_IN using the recovery clocks, and/or generate recovery data, etc., but the example embodiments are not limited thereto.

In order to generate the recovery clocks from the input data D_IN, the clock data recovery circuit 100 first may generate reference clocks REF_CLKs, which will be described in greater detail below, from the input data D_IN, and generate recovery data using the reference clocks REF_CLKs (e.g., reference clock signals, etc.), but the example embodiments are not limited thereto. According to at least one example embodiment, the recovery clocks (e.g., recovery clock signals) may be referred to as sampling clocks (e.g., sampling clock signals) used for a sampling operation, but the example embodiments are not limited thereto. For example, the plurality of recovery clocks may include an I clock CLK_I, an inverted I clock CLK_IB, a Q clock CLK_Q, and/or an inverted Q clock CLK_QB, etc., but are not limited thereto.

Meanwhile, the input data D_IN, during a period in which the clock data recovery circuit 100 generates the reference clocks REF_CLKs, may include an embedded clock, and accordingly, the input data D_IN may include a certain and/or desired pattern, etc. The input data D_IN, during the period in which the clock data recovery circuit 100 generates the recovery clocks using the reference clocks REF_CLKs, may include a random pattern (e.g., a randomly generated desired pattern), and the random pattern may have been previously agreed upon between the clock data recovery circuit 100 and a transmitting side (e.g., the transmitter, etc.), but the example embodiments are not limited thereto. Hereinafter, an operation in the period in which the clock data recovery circuit 100 generates the recovery clocks will be mainly described.

In at least one example embodiment, a sampler 110 (e.g., sampler circuit, sampler circuitry, etc.) may receive the input data D_IN from the outside and/or externally (e.g., a transmitting circuit and/or a transmitter), but is not limited thereto. For example, the sampler 110 may receive the input data D_IN through a serial data link and/or another type of data link. In some example embodiments, the input data D_IN may be provided to the sampler 110 after preprocessing operations such as equalization, amplification, and/or filtering, etc., are performed thereon, but the example embodiments are not limited thereto. Additionally, the sampler 110 may receive the recovery clocks from an inphase-quadrature (I-Q) merged phase interpolator 130, but is not limited thereto. The recovery clocks may also be referred to as a recovery clock set, and as described above, the recovery clocks may include the I clock CLK_I, the inverted I clock CLK_IB, the Q clock CLK_Q, and/or the inverted Q clock CLK_QB, etc. However, the example embodiments are not limited thereto, and the sampler 110 may receive and/or require a greater or lesser number of recovery clocks to sample the input data D_IN, etc. The sampler 110 may sample the input data D_IN using the I clock CLK_I, the inverted I clock CLK_IB, the Q clock CLK_Q, and/or the inverted Q clock CLK_QB, etc., and generate and provide a sampling result SAMP to a control circuit 120, etc., but is not limited thereto. Specifically, the sampler 110 may select some of (e.g., at least one of, a subset of, etc.) the I clock CLK_I, the inverted I clock CLK_IB, the Q clock CLK_Q, and the inverted Q clock CLK_QB, etc., to sample the input data D_IN at a rising edge of the selected clock and generate sample data. In this way, the sampler 110 may select the I clock CLK_I, the inverted I clock CLK_IB, the Q clock CLK_Q, and the inverted Q clock CLK_QB in various combinations to perform a sampling operation on the input data D_IN at a plurality of different times, etc. The sampling result SAMP may include a plurality of sample data generated through a plurality of sampling operations, but is not limited thereto.

The control circuit 120 according to at least one example embodiment may generate a control signal CS for controlling phases of the recovery clocks CLK_I, CLK_IB, CLK_Q, and CLK_QB based on the sampling result SAMP, and provide the control signal CS to the I-Q merged phase interpolator 130, etc.

In at least one example embodiment, the I-Q merged phase interpolator 130 (e.g., the I-Q merged phase interpolator circuit, the I-Q merged phase interpolator circuitry, etc.) may adjust the phases of the plurality of recovery clocks CLK_I, CLK_IB, CLK_Q, and/or CLK_QB, etc., based on the control signal CS, and provide the recovery clocks CLK_I, CLK_IB, CLK_Q, and/or CLK_QB, etc., whose phases are adjusted to the sampler 110, etc., but is not limited thereto. In the same way as above, a loop operation configured by the sampler 110, the control circuit 120, and/or the I-Q merged phase interpolator 130 may be performed a plurality of times, and as a result, the phases of the plurality of recovery clocks CLK_I, CLK_IB, CLK_Q, and/or CLK_QB, etc., may be determined. The plurality of recovery clocks CLK_I, CLK_IB, CLK_Q, and/or CLK_QB, etc., whose phases are determined may be used for a sampling operation of the input data D_IN processed by a processing circuit (not shown), but the example embodiments are not limited thereto.

In at least one example embodiment, a reference loop circuit 140 may generate the plurality of reference clocks REF_CLKs from the input data D_IN, but is not limited thereto. As described above, during the period in which the reference clocks REF_CLKs are generated, the input data D_IN may include an embedded clock (e.g., embedded clock signal, etc.), and the reference loop circuit 140 may generate the reference clocks REF_CLKs corresponding to the embedded clock. In some example embodiments, the reference loop circuit 140 may be implemented as a phase locked loop and/or a delay locked loop, but the example embodiments are not limited thereto. In at least one example embodiment, the plurality of reference clocks REF_CLKs may include, for example, four clocks having a phase difference of 90 degrees from each other, but the example embodiments are not limited thereto. The reference loop circuit 140 may provide the reference clocks REF_CLKs having a fixed phase to the I-Q merged phase interpolator 130, etc.

In at least one example embodiment, the I-Q merged phase interpolator 130 may be implemented in a way such that a configuration generating the I clock CLK_I and the inverted I clock CLK_IB and a configuration generating the Q clock CLK_Q and the inverted Q clock CLK_QB are merged. That is, the I-Q merged phase interpolator 130 may receive the control signal CS and the plurality of reference clocks REF_CLKs, and collectively generate and output the I clock CLK_I, the inverted I clock CLK_IB, the Q clock CLK_Q and/or the inverted Q clock CLK_QB, etc., based on the control signal CS and the plurality of reference clocks REF_CLKs to the sampler 110, etc. Hereinafter, FIG. 1B is further referred to for better understanding of the I-Q merged phase interpolator 130 according to at least one example embodiment of the inventive concepts.

Referring further to FIG. 1B, the clock data recovery circuit 100' according to the comparative example may include an I phase interpolator 131' (e.g., an I phase interpolator circuit, I phase interpolator circuitry, etc.) and a Q phase interpolator 132' (e.g., a Q phase interpolator circuit, Q phase interpolator circuitry, etc.) independent of each other. Each of the I phase interpolator 131' and the Q phase interpolator 132' may receive the control signal CS from a control circuit 120', and receive the reference clocks REF_CLKs from a reference loop circuit 140'. The I phase interpolator 131' may generate the I clock CLK_I and the inverted I clock CLK_IB based on the control signal CS and the reference clocks REF_CLKs, and the Q phase interpolator 132' may generate the Q clock CLK_Q and the inverted Q clock CLK_QB based on the signal CS and the reference clocks REF_CLKs, etc. In the comparative example, the I phase interpolator 131' and the Q phase interpolator 132' may be implemented independently to have an interstructural timing skew. That is, each of the I phase interpolator 131' and the Q phase interpolator 132' may include a decoder, a current steering digital to analog converter (DAC), etc., and a timing mismatch between decoders or current steering DACs may occur due to a process (e.g., a process variation, manufacturing defect, etc.), etc. Accordingly, an unexpected phase difference may occur between the I clock CLK_I and the Q clock CLK_Q due to a structural issue, and the phase difference may cause deterioration of a sampling operation, inaccuracy in the sampling operation, errors in the sampling operation, etc.

Referring back to FIG. 1A, the I-Q merged phase interpolator 130 according to at least one example embodiment of the inventive concepts may generate the I clock CLK_I, the inverted I clock CLK_IB, the Q clock CLK_Q and/or the inverted Q clock CLK_QB, etc., using a single decoder and/or a single current steering DAC. As a result, an unexpected phase difference between the I clock CLK_I and the Q clock CLK_Q may be decreased, reduced, and/or minimized, thereby improving the quality of the recovery data, the accuracy of the recovery data, reduce the number of errors in the recovery data, etc.

Figure 2:
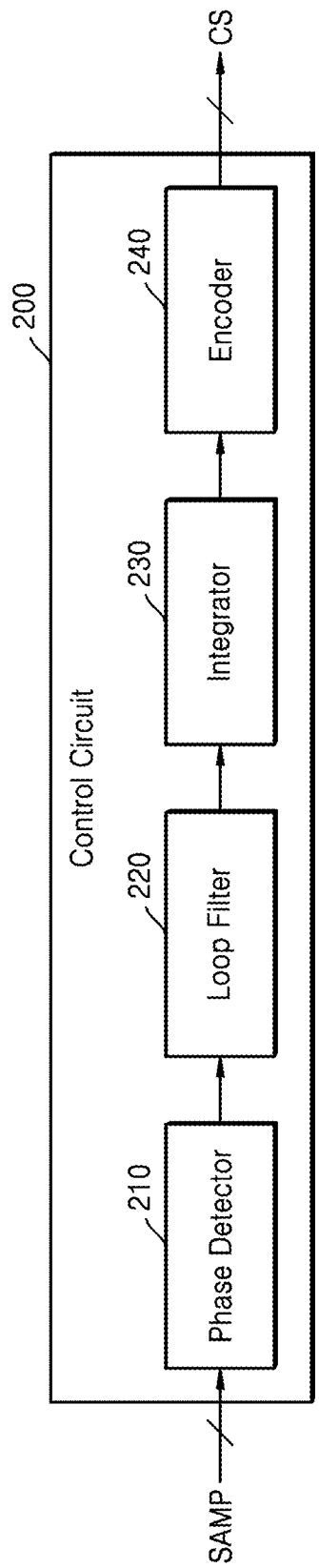
FIG. 2 is a block diagram illustrating a control circuit according to at least one example embodiment of the inventive concepts.

FIG. 2 is a block diagram illustrating a control circuit 200 according to at least one example embodiment of the inventive concepts.

Referring to FIG. 2, the control circuit 200 may include a phase detector 210, a loop filter 220, an integrator 230, and/or an encoder 240, etc., but the example embodiments are not limited thereto. The phase detector 210 (e.g., phase detector circuitry, etc.) may receive the sampling result SAMP and detect a phase of the input data D_IN (e.g., as shown in FIG. 1A, etc.) based on the sampling result SAMP, but is not limited thereto. The phase detector 210 may provide a result of detecting the phase of the input data D_IN (e.g., as shown in FIG. 1A, etc.) to the loop filter 220 (e.g., loop filter circuitry, etc.). The loop filter 220 may generate a combined signal by accumulating charges (e.g., electrical charge, current, etc.) whose supply amount is controlled according to and/or based on the phase detection result. The loop filter 220 may provide the combined signal to the integrator 230 (e.g., integrator circuitry, etc.). The integrator 230 may integrate the combined signal and provide the integrated combined signal to the encoder 240 (e.g., encoder circuitry, etc.). The encoder 240 may generate the control signal CS based on the integrated combined signal. In at least one example embodiment, the control signal CS may have a format suitable for an operation of the I-Q merged phase interpolator 130 of FIG. 1A, which will be described in detail below with reference to FIG. 3. However, the implementation of the control circuit 200 of FIG. 2 is only an example, and the example embodiments of the inventive concepts are not limited thereto, and various implementations for controlling the I-Q merged phase interpolator 130 of FIG. 1A are applicable. According to some example embodiments, the control circuit 200 (including the phase detector 210, loop filter 220, integrator 230, and/or encoder 240, etc.) may be implemented as processing circuitry. The processing circuitry may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Figure 3:
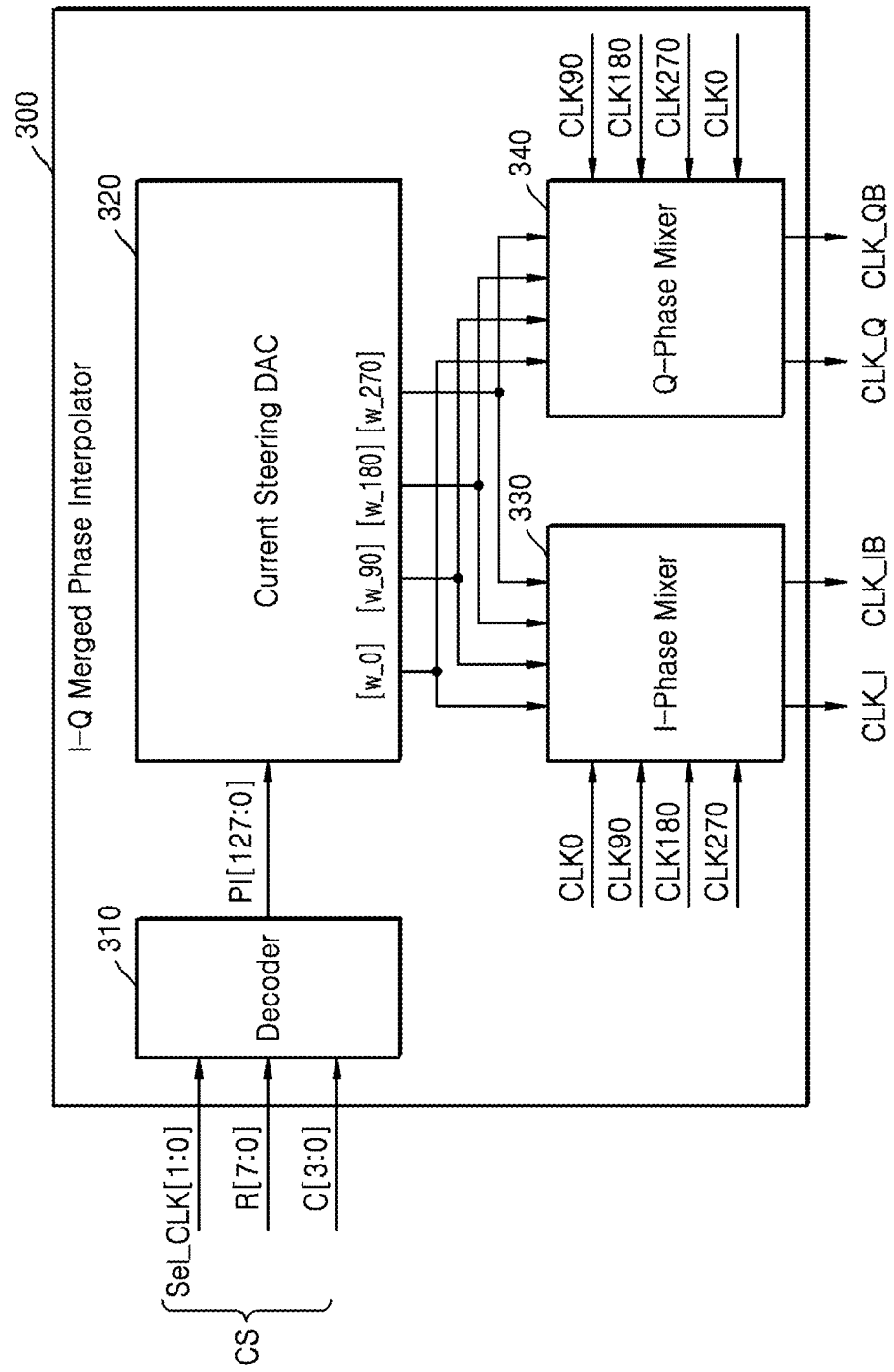
FIG. 3 is a block diagram illustrating an inphase-quadrature (I-Q) merged phase interpolator according to at least one example embodiment of the inventive concepts.

FIG. 3 is a block diagram illustrating an I-Q merged phase interpolator 300 according to at least one example embodiment of the inventive concepts. Meanwhile, the I-Q merged phase interpolator 300 shown in FIG. 3 is only an example for assisting understanding of the example embodiments of the inventive concepts, but the example embodiments are not limited thereto, and for example, the configuration and number of bits of the control signal CS, the number of bits of a phase interpolation code PI and/or the components included in the I-Q merged phase interpolator 300, etc., may be implemented in various ways in the example embodiments of the inventive concepts.

Referring to FIG. 3, the I-Q merged phase interpolator 300 may include a decoder 310, a current steering DAC 320, an I-phase mixer 330, and/or a Q-phase mixer 340, etc., but the example embodiments are not limited thereto. In at least one example embodiment, the decoder 310 (e.g., decoder circuitry, etc.) may receive the control signal CS from the control circuit 120 of FIG. 1A, but is not limited thereto. For example, the control signal CS includes a clock selection signal Sel_CLK[1:0] for selecting a phase interpolation window, a row signal R[7:0] for adjusting a degree of phase interpolation, and/or a column signal C[3:0], but the example embodiments are not limited thereto, and for example the clock selection signal, row signal, and/or column signal may have a greater or lesser number of bits than shown in FIG. 3, etc. In at least one example embodiment, as shown in FIG. 3, the phase interpolation window may be determined as (and/or based on) two reference clocks having a phase difference of 90 degrees from each other among a plurality of reference clock signals, e.g., first to fourth reference clocks CLK0, CLK90, CLK180, and CLK270, and four phase interpolation windows may be determined as (and/or based on), e.g., the first reference clock CLK0 and the second reference clock CLK90, the second reference clock CLK90 and the third reference clock CLK180, the third reference clock CLK180 and the fourth reference clock CLK270, and the fourth reference clock CLK270 and the first reference clock CLK0, etc., but the example embodiments are not limited thereto. In at least one example embodiment, the degree of phase interpolation with respect to the recovery clocks CLK_I, CLK_IB, CLK_Q, and CLK_QB may be adjusted based on a combination of the row signal R[7:0] and the column signal C[3:0], etc., but the example embodiments are not limited thereto.

In at least one example embodiment, the decoder 310 may generate a phase interpolation code PI[127:0] based on the clock selection signal Sel_CLK[1:0], the row signal R[7:0] and/or the column signal C[3:0], etc., but is not limited thereto. The decoder 310 may provide the phase interpolation code PI[127:0] to the current steering DAC 320 (e.g., steering DAC circuitry, etc.).

In at least one example embodiment, the current steering DAC 320 may generate a plurality of analog input signals, e.g., first to fourth analog inputs [w_0], [w_90], [w_180], and [w_270], etc., based on the phase interpolation code PI[127:0], but the example embodiments are not limited thereto. In at least one example embodiment, an analog input may be a signal for adjusting one or more phases of the recovery clocks CLK_I, CLK_IB, CLK_Q, and/or CLK_QB, etc., by weighting the recovery clock signals using a certain and/or desired phase. For example, as the first analog input [w_0] increases, the phase of the I clock CLK_I may be adjusted to approach 0 degree, but the example embodiments are not limited thereto. The current steering DAC 320 may adjust magnitudes of the first to fourth analog inputs [w_0], [w_90], [w_180], and [w_270] based on the phase interpolation code PI[127:0] to adjust the phases of the recovery clocks CLK_I, CLK_IB, CLK_Q, and CLK_QB, etc.

In at least one example embodiment, the I-phase mixer 330 (e.g., I-phase mixer circuitry, etc.) and the Q-phase mixer 340 (e.g., Q-phase mixer circuitry, etc.) may commonly receive the plurality of analog inputs, e.g., first to fourth analog inputs [w_0], [w_90], [w_180], and [w_270] from the current steering DAC 320, etc. Specifically, the I-phase mixer 330 and the Q-phase mixer 340 may share a first output node of the current steering DAC 320 that outputs the first analog input [w_0], and may simultaneously receive the first analog input [w_0]. The I-phase mixer 330 and the Q-phase mixer 340 may share a second output node of the current steering DAC 320 that outputs the second analog input [w_90], and may simultaneously receive the second analog input [w_90]. The I-phase mixer 330 and Q-phase mixer 340 may share a third output node of the current steering DAC 320 that outputs the third analog input [w_180], and may simultaneously receive the third analog input [w_180]. In addition, the I-phase mixer 330 and the Q-phase mixer 340 may share a fourth output node of the current steering DAC 320 that outputs the fourth analog input [w_270], and may simultaneously receive the fourth analog input [w_270].

The I-phase mixer 330 and the Q-phase mixer 340 according to at least one example embodiment may commonly receive the plurality of analog inputs, e.g., first to fourth analog inputs [w_0], [w_90], [w_180], and [w_270], etc., and may generate the recovery clocks CLK_I, CLK_IB, CLK_Q, and CLK_QB, etc., from the single decoder 310 and the single current steering DAC 320, thereby decreasing, reducing, and/or minimizing an unexpected phase difference between the I clock CLK_I and the Q clock CLK_Q.

Meanwhile, the I-phase mixer 330 may generate the I clock CLK_I and the inverted I clock CLK_IB using the plurality of reference clocks CLK0, CLK90, CLK180, and CLK270, etc., and the Q-phase mixer 340 may generate the Q clock CLK_Q and the inverted Q clock CLK_QB using the plurality of reference clocks CLK90, CLK180, CLK270, and CLK0, etc. The reason why the reference clocks received by the I-phase mixer 330 and the Q-phase mixer 340 are shown in different order from each other in FIG. 3 is to indicate that the reference clocks used to generate the I clock CLK_I and the inverted I clock CLK_IB, and the reference clocks used to generate the Q clock CLK_Q and the inverted Q clock CLK_QB are different from each other, but the example embodiments are not limited thereto. This will be described in detail below with reference to FIG. 4.

Figure 4:
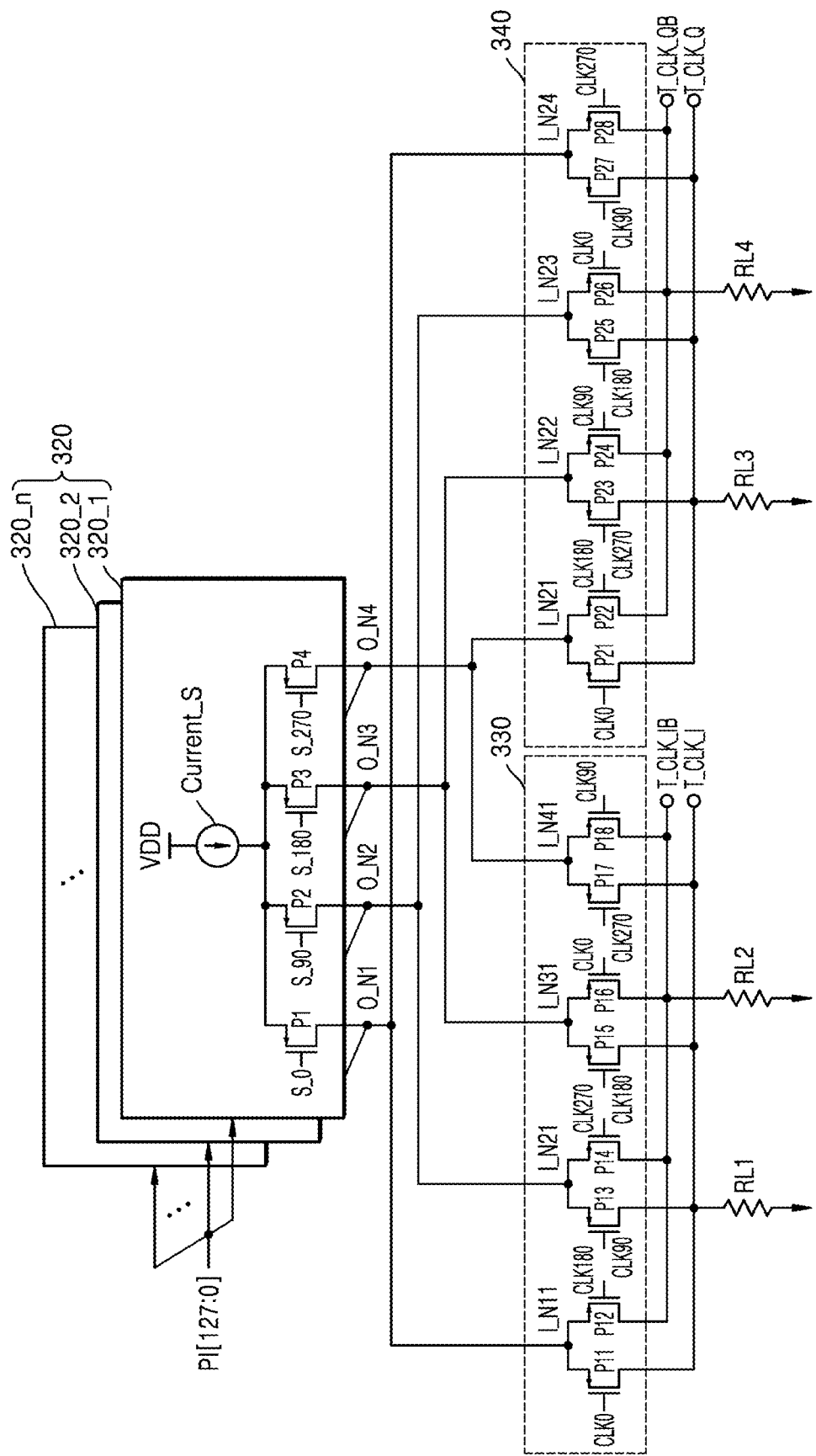
FIG. 4 is a circuit diagram illustrating a current steering DAC, an I-phase mixer, and a Q-phase mixer of FIG. 3 according to some example embodiments.

FIG. 4 is a circuit diagram illustrating the current steering DAC 320, the I-phase mixer 330, and the Q-phase mixer 340 of FIG. 3 according to some example embodiments.

Referring to FIG. 4, the current steering DAC 320 of FIG. 3 may include first to n-th (where n is an integer greater than or equal to 2) DAC circuits 320_1 to 320_n, but is not limited thereto. In at least one example embodiment, the first to n-th DAC circuits 320_1 to 320_n may be coupled in parallel with each other, but is not limited thereto. As an example, the first to n-th DAC circuits 320_1 to 320_n may share first to fourth output nodes O_N1 to O_N4, etc.

In at least one example embodiment, the first DAC circuit 320_1 may include at least one current source Current_S (e.g., a current generator, etc.) and a plurality of transistors, e.g., first to fourth p-channel metal-oxide-semiconductor (pMOS) transistors P1 to P4, etc. Each of source terminals of the first to fourth pMOS transistors P1 to P4 may be coupled to the current source Current_S, and drain terminals of the first to fourth pMOS transistors P1 to P4 may be respectively coupled to the first to fourth output nodes O_N1 to O_N4, but the example embodiments are not limited thereto. However, the types of transistors P1 to P4 included in the first DAC circuit 320_1 as shown in FIG. 4 are only examples, and are not limited thereto, and the transistors P1 to P4 may be implemented as various types of transistors, such as an n-channel MOS (nMOS) transistor, a field effect transistor (FET), etc.

The current source Current_S may be coupled to a supply voltage VDD to draw a certain amount current from the supply voltage VDD. The plurality of transistors, e.g., first to fourth pMOS transistors P1 to P4, may receive a plurality of controls signals, e.g., first to fourth on/off control signals S_0, S_90, S_180, and S_270, respectively, through a gate terminal. The first to fourth on/off control signals S_0, S_90, S_180, and S_270 are included in the phase interpolation code PI[127:0] and each may include 1 bit, but are not limited thereto. The first to fourth pMOS transistors P1 to P4 may be turned on/off based on the first to fourth on/off control signals S_0, S_90, S_180, and S_270, respectively, and a current generated from the current source Current_S may be output through a turned-on pMOS transistor among the first to fourth pMOS transistors P1 to P4, but the example embodiments are not limited thereto. In at least one example embodiment, the first to fourth pMOS transistors P1 to P4 may be defined as constituting paths through which the current of the current source Current_S flows, the turned-on pMOS transistor may be referred to as an activated path, and a turned-off pMOS transistor may be referred to as an inactivated path.

The above-described configuration and operation of the first DAC circuit 320_1 may also be applied to the remaining DAC circuits 320_2 to 320_n, but the example embodiments are not limited thereto, and for example, the remaining DAC circuits 320_2 to 320_n may have different configurations and/or may be operated differently. The currents output from the first to n-th DAC circuits 320_1 to 320_n may be summed in the first to fourth output nodes O_N1 to O_N4, and may respectively output as the first to fourth analog inputs [w_0], [w_90], [w_180], and [w_270]) of, for example, FIG. 3, etc., but the example embodiments are not limited thereto. The I-phase mixer 330 and the Q-phase mixer 340 may commonly receive the first to fourth analog inputs [w_0], [w_90], [w_180], and [w_270] of, e.g., FIG. 3, but are not limited thereto.

In at least one example embodiment, the first to n-th DAC circuits 320_1 to 320_n may output the plurality of currents through the activated path based on respectively received codes (and/or on/off control signals) among the phase interpolation codes PI[127:0], and the currents output from the first to n-th DAC circuits 320_1 to 320_n may be summed and provided to the I-phase mixer 330 and the Q-phase mixer 340 as the first to fourth analog inputs [w_0], [w_90], [w_180], and [w_270] of, e.g., FIG. 3, but the example embodiments are not limited thereto. For example, as the number of DAC circuits outputting current through the first output node O_N1 increases, the magnitude of the first analog input [w_0] of FIG. 3 may increase. As described above, the magnitudes of the first to fourth analog inputs [w_0], [w_90], [w_180], and [w_270] may be adjusted by and/or based on the phase interpolation code PI[127:0].

In at least one example embodiment, the I-phase mixer 330 may include fifth to twelfth pMOS transistors P11 to P18, but the example embodiments are not limited thereto. Specifically, a source terminal of the fifth pMOS transistor P11 may be coupled to a source terminal of the sixth pMOS transistor P12 through the first input node I_N11, a drain terminal of the fifth pMOS transistor P11 may be coupled to a first terminal T_CLK_I outputting the I clock, and a drain terminal of the sixth pMOS transistor P12 may be coupled to a second terminal T_CLK_IB outputting the inverted I clock, etc. The fifth pMOS transistor P11 may receive the first reference clock CLK0 having a phase of 0 degree through the gate terminal, and in response thereto, output, through the first terminal T_CLK_I, the first analog input received through the first input node I_N11, but is not limited thereto. The sixth pMOS transistor P12 may receive the third reference clock CLK180 having a phase of 180 degrees through the gate terminal, and in response thereto, output, through the second terminal T_CLK_IB, the first analog input received through the first input node I_N11, but the example embodiments are not limited thereto.

A source terminal of the seventh pMOS transistor P13 may be coupled to a source terminal of the eighth pMOS transistor P14 through the second input node I_N21, a drain terminal of the source terminal of the seventh pMOS transistor P13 may be coupled to the first terminal T_CLK_I outputting the I clock, and a drain terminal of the eighth pMOS transistor P14 may be coupled to the second terminal T_CLK_IB outputting the inverted I clock, but the example embodiments are not limited thereto. The seventh pMOS transistor P13 may receive the second reference clock CLK90 having a phase of 90 degrees through the gate terminal, and in response thereto, output, through the first terminal T_CLK_I, the second analog input received through the second input node I_N21, but is not limited thereto. The eighth pMOS transistor P14 may receive the fourth reference clock CLK270 having a phase of 270 degrees through the gate terminal, and in response thereto, output, through the second terminal T_CLK_IB, the second analog input received through the second input node I_N21, but is not limited thereto.

A source terminal of the ninth pMOS transistor P15 may be coupled to a source terminal of the tenth pMOS transistor P16 through the third input node I_N31, a drain terminal of the ninth pMOS transistor P15 may be coupled to the first terminal T_CLK_I outputting the I clock, and a drain terminal of the tenth pMOS transistor P16 may be coupled to the second terminal T_CLK_IB outputting the inverted I clock, etc. The ninth pMOS transistor P15 may receive the third reference clock CLK180 having a phase of 180 degrees through the gate terminal, and in response thereto, output, through the first terminal T_CLK_I, the third analog input received through the third input node I_N31, etc. The tenth pMOS transistor P16 may receive the first reference clock CLK0 having a phase of 0 degree through the gate terminal, and in response thereto, output, through the second terminal T_CLK_IB, the third analog input received through the third input node I_N31, etc.

A source terminal of the eleventh pMOS transistor P17 may be coupled to a source terminal of the twelfth pMOS transistor P18 through the fourth input node I_N41, a drain terminal of the eleventh pMOS transistor P17 may be coupled to the first terminal T_CLK_I outputting the I clock, and a drain terminal of the twelfth pMOS transistor P18 may be coupled to the second terminal T_CLK_IB outputting the inverted I clock, but the example embodiments are not limited thereto. The eleventh pMOS transistor P17 may receive the fourth reference clock CLK270 having a phase of 270 degrees through the gate terminal, and in response thereto, output, through the first terminal T_CLK_I, the fourth analog input received through the fourth input node I_N41, but is not limited thereto. The twelfth pMOS transistor P18 may receive the second reference clock CLK90 having a phase of 90 degrees through the gate terminal, and in response thereto, output, through the second terminal T_CLK_IB, the fourth analog input received through the fourth input node I_N41, but is not limited thereto.

Meanwhile, in at least one example embodiment, the configuration of the fifth and sixth pMOS transistors P11 and P12 may be defined as a first output circuit, the configuration of the seventh and eighth pMOS transistors P13 and P14 may be defined as a second output circuit, the configuration of the ninth and tenth pMOS transistors P15 and P16 may be defined as a third output circuit, and the configuration of the eleventh and twelfth pMOS transistors P17 and P18 may be defined as a fourth output circuit, but the example embodiments are not limited thereto. In the first terminal T_CLK_I, outputs from the first to fourth output circuits may be summed and output as the I clock, and in the second terminal T_CLK_IB, outputs from the first to fourth output circuits may be summed and output as the inverted I clock, etc. Also, in at least one example embodiment, the I clock and the inverted I clock output by the I-phase mixer 330 may be referred to as a first clock pair. In at least one example embodiment, the first terminal T_CLK_I may be coupled to a first load resistor RL1, and the second terminal T_CLK_IB may be coupled to a second load resistor RL2, but the example embodiments are not limited thereto.

In at least one example embodiment, the Q-phase mixer 340 may include thirteenth to twentieth pMOS transistors P21 to P28, but is not limited thereto. Specifically, a source terminal of the thirteenth pMOS transistor P21 may be coupled to a source terminal of the fourteenth pMOS transistor P22 through the fifth input node I_N21, the drain terminal of the thirteenth pMOS transistor P21 may be coupled to the third terminal T_CLK_Q outputting the Q clock, and a drain terminal of the fourteenth pMOS transistor P22 may be coupled to the second terminal T_CLK_QB outputting the inverted Q clock, but the example embodiments are not limited thereto. The thirteenth pMOS transistor P21 may receive the first reference clock CLK0 having a phase of 0 degree through the gate terminal, and in response thereto, output, through the third terminal T_CLK_Q, the fourth analog input received through the fifth input node I_N21, but is not limited thereto. The fourteenth pMOS transistor P22 may receive the third reference clock CLK180 having a phase of 180 degrees through the gate terminal, and in response thereto, output, through the fourth terminal T_CLK_QB, the fourth analog input received through the fifth input node I_N21, but is not limited thereto.

The source terminal of the fifteenth pMOS transistor P23 may be coupled to a source terminal of the sixteenth pMOS transistor P24 through the sixth input node I_N22, a drain terminal of the fifteenth pMOS transistor P23 may be coupled to the third terminal T_CLK_Q outputting the Q clock, and a drain terminal of the sixteenth pMOS transistor P24 may be coupled to the fourth terminal T_CLK_QB outputting the inverted Q clock, but the example embodiments are not limited thereto. The fifteenth pMOS transistor P23 may receive the fourth reference clock CLK270 having a phase of 270 degrees through the gate terminal, and in response thereto, output, through the third terminal T_CLK_Q, the third analog input received through the sixth input node I_N22, but is not limited thereto. The sixteenth pMOS transistor P24 may receive the second reference clock CLK90 having a phase of 90 degrees through the gate terminal, and in response thereto, output, through the fourth terminal T_CLK_QB, the third analog input received through the sixth input node I_N22, but is not limited thereto.

A source terminal of the seventeenth pMOS transistor P25 may be coupled to a source terminal of the eighteenth pMOS transistor P26 through the seventh input node I_N23, a drain terminal of the seventeenth pMOS transistor P25 may be coupled to the third terminal T_CLK_Q outputting the Q clock, and a drain terminal of the eighteenth pMOS transistor P26 may be coupled to the fourth terminal T_CLK_QB outputting the inverted Q clock, but the example embodiments are not limited thereto. The seventeenth pMOS transistor P25 may receive the third reference clock CLK180 having a phase of 180 degrees through the gate terminal, and in response thereto, through the third terminal T_CLK_Q, the second analog input received through the seventh input node I_N23, but is not limited thereto. The eighteenth pMOS transistor P26 may receive the first reference clock CLK0 having a phase of 0 degree through the gate terminal, and in response thereto, through the fourth terminal T_CLK_QB, the second analog input received through the seventh input node I_N23, but is not limited thereto.

A source terminal of the 19th pMOS transistor P27 may be coupled to a source terminal of the twentieth pMOS transistor P28 through the eighth input node I_N24, a drain terminal of the 19th pMOS transistor P27 may be coupled to the third terminal T_CLK_Q outputting the Q clock, and a drain terminal of the twentieth pMOS transistor P28 may be coupled to the fourth terminal T_CLK_QB outputting the inverted Q clock, but the example embodiments are not limited thereto. The nineteenth pMOS transistor P27 may receive the second reference clock CLK90 having a phase of 90 degrees through the gate terminal, and in response thereto, through the third terminal T_CLK_Q, the first analog input received through the eighth input node I_N24, but is not limited thereto. The twentieth pMOS transistor P28 may receive the fourth reference clock CLK270 having a phase of 270 degrees through the gate terminal, and in response thereto, through the fourth terminal T_CLK_QB, the first analog input received through the eighth input node I_N24, but is not limited thereto.

Meanwhile, in at least one example embodiment, the configuration of the thirteenth and fourteenth pMOS transistors P21 and P22 may be defined as a fifth output circuit, the configuration of the fifteenth and sixteenth pMOS transistors P23 and P24 may be defined as a sixth output circuit, the configuration of the seventeenth and eighteenth pMOS transistors P25 and P26 may be defined as a seventh output circuit, and the configuration of the nineteenth and twentieth pMOS transistors P27 and P28 may be defined as an eighth output circuit, etc. In the third terminal T_CLK_Q, outputs from the fifth to eighth output circuits may be summed and output as the Q clock, and in the fourth terminal T_CLK_QB, outputs from the fifth to eighth output circuits may be summed and output as the inverted Q clock, but the example embodiments are not limited thereto. Also, in at least one example embodiment, the Q clock and the inverted Q clock output by the Q-phase mixer 340 may be referred to as a second clock pair. In at least one example embodiment, the third terminal T_CLK_Q may be coupled to a third load resistor RL3, and the fourth terminal T_CLK_QB may be coupled to a fourth load resistor RL4, but are not limited thereto.

In at least one example embodiment, the first output circuit of the I-phase mixer 330 and the eighth output circuit of the Q-phase mixer 340 may share the first output node O_N1 of the current steering DAC 320, the second output circuit of the I-phase mixer 330 and the seventh output circuit of the Q-phase mixer 340 may share the second output node O_N2 of the current steering DAC 320, the third output circuit of the I-phase mixer 330 and the sixth output circuit of the Q-phase mixer 340 may share the third output node O_N3 of the current steering DAC 320, and the fourth output circuit of the I-phase mixer 330 and the fifth output circuit of the Q-phase mixer 340 may share the fourth output node O_N4 of the current steering DAC 320, but the example embodiments are not limited thereto.

In at least one example embodiment, the reference clocks provided to the output circuit of the I-phase mixer 330 and the output circuit of the Q-phase mixer 340 sharing the output node of the current steering DAC 320 may have a phase difference of 90 degrees, but the example embodiments are not limited thereto, and the reference clocks may have a different phase difference. For example, the first reference clock CLK0 and the third reference clock CLK180 may be provided to the first output circuit, and the second reference clock CLK90 having a phase difference of 90 degrees with respect to the first reference clock CLK0 and the fourth reference clock CLK270 having a phase difference of 90 degrees with respect to the third reference clock CLK180 may be provided to the eighth output circuit, etc.

However, the types of and/or number of transistors P11 to P18 and P21 to P28 included in the I-phase mixer 330 and the Q-phase mixer 340 are only examples, and the example embodiments of the inventive concepts are not limited thereto, and the transistors P11 to P18 and P21 to P28 may be implemented in various types of transistors, such as an n-channel MOS (nMOS) transistor and/or a field effect transistor (FET), etc. In addition, the I-phase mixer 330 and the Q-phase mixer 340 are not limited to the at least one example embodiment shown in FIG. 4, and may be implemented in any one of various configurations for combining with the current steering DAC 320 according to other example embodiments of the inventive concepts.

The I-phase mixer 330 and the Q-phase mixer 340 according to at least one example embodiment may commonly receive the plurality of analog inputs, e.g., first to fourth analog inputs, from the current steering DAC 320, and may generate and output I clock, an inverted I clock, a Q clock, and/or an inverted Q clock in response to the plurality of reference clocks, e.g., first to fourth reference clocks CLK0, CLK90, CLK180, and CLK270.

Figure 5:
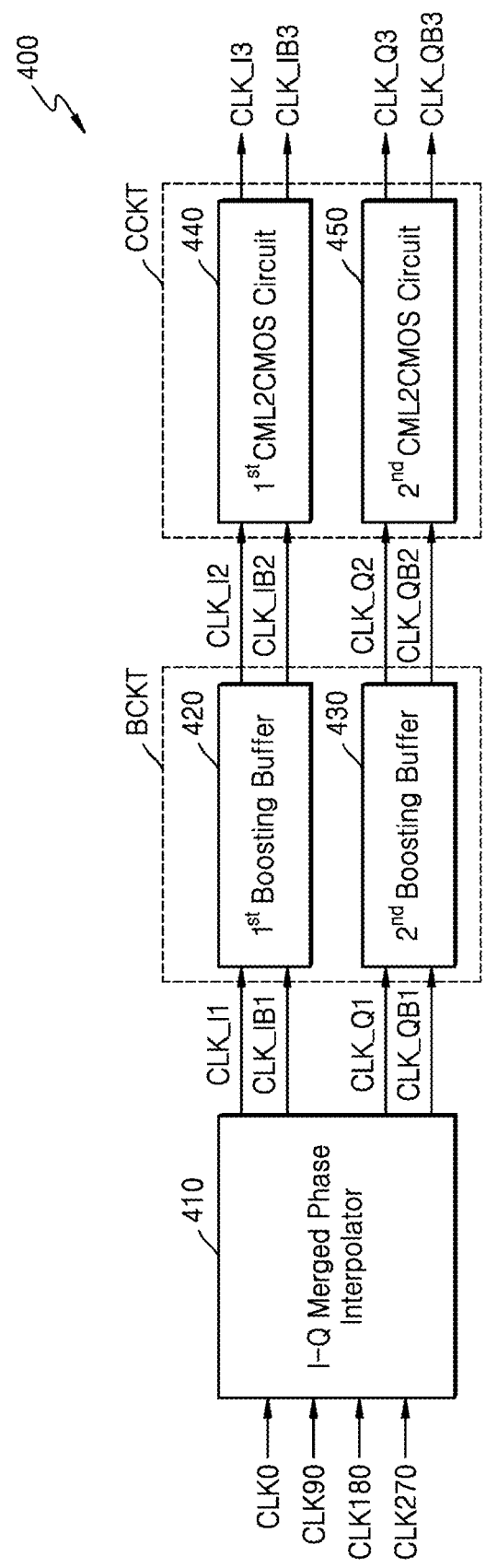
FIG. 5 is a block diagram illustrating a clock data recovery circuit according to at least one example embodiment of the inventive concepts.

FIG. 5 is a block diagram illustrating a clock data recovery circuit 400 according to at least one example embodiment of the inventive concepts.

Referring to FIG. 5, the clock data recovery circuit 400 may include an I-Q merged phase interpolator 410 (e.g., I-Q merged phase interpolator circuitry, etc.), a boosting circuit BCKT, and/or a conversion circuit CCKT, etc., but the example embodiments are not limited thereto. The boosting circuit BCKT may include a plurality of boosting buffers, e.g., first and second boosting buffers 420 and 430, etc., and the conversion circuit CCKT may include a plurality of current mode logic to complementary metal oxide semiconductor (CML2CMOS) circuits (e.g., current mode logic circuitry, etc.), e.g., first and second current mode logic to complementary metal oxide semiconductor (CML2CMOS) circuits 440 and 450, etc., but the example embodiments are not limited thereto. In some example embodiments, the clock data recovery circuit 400 may include only any one of the boosting circuit BCKT and the conversion circuit CCKT, etc.

As described above, the I-Q merged phase interpolator 410 may generate a first clock pair CLK_I1 and CLK_IB1 and a second clock pair CLK_Q1 and CLK_QB1 using the first to fourth reference clocks CLK0, CLK90, CLK180, and CLK270, but is not limited thereto.

An output waveform of the I-Q merged phase interpolator 410 may be amplitude-modulated according to and/or based on a change in a phase interpolation code, and thus may have a distorted shape in the output waveform at a current mode logic (CML) level. Accordingly, when the output of the I-Q merged phase interpolator 410 is converted from the CML level to the CMOS level by the conversion circuit CCKT, the distorted waveform at the CML level may cause a duty cycle distortion at the CMOS level. In order to decrease, reduce, and/or prevent such duty cycle distortion, the boosting buffer BCKT may boost the first clock pair CLK_I1 and CLK_IB1 and the second clock pair CLK_Q1 and CLK_QB1, or in other words amplify the first clock pair signals CLK_I1 and CLK_IB1 and the second clock pair signals CLK_Q1 and CLK_QB1, etc.

In at least one example embodiment, the first boosting buffer 420 (e.g., boost buffer circuitry, booster circuitry, buffer amplifier circuitry, etc.) may receive the first clock pair CLK_I1 and CLK_IB1 from the I-Q merged phase interpolator 410, boost (e.g., amplify) components of the first clock pair CLK_I1 and CLK_IB1 in a target frequency band (e.g., a desired frequency band, etc.), maintain phase information of the first clock pair CLK_I1 and CLK_IB1 and/or maintain phase information as much as possible, e.g., maintain the phase information of the original clock pair signals within a desired percentage range, such as +/−15%, and simultaneously decrease and/or remove the influence of amplitude modulation in the I-Q merged phase interpolator 410, etc., but the example embodiments are not limited thereto.

In at least one example embodiment, the second boosting buffer 430 may receive the second clock pair CLK_Q1 and CLK_QB1 from the I-Q merged phase interpolator 420, boost (e.g., amplify) components of the second clock pair CLK_Q1 and CLK_QB1 in a target frequency band (e.g., a desired frequency band, etc.), maintain phase information of the second clock pair CLK_Q1 and CLK_QB1 and/or maintain phase information as much as possible, e.g., maintain the phase information of the original clock pair signals within a desired percentage range, such as +/−15%, and simultaneously decrease and/or remove the influence of amplitude modulation in the I-Q merged phase interpolator 410, but the example embodiments are not limited thereto.

In at least one example embodiment, the target frequency band may be previously set and/or configured according to frequency characteristics of the first clock pair CLK_I1 and CLK_IB1 and the second clock pair CLK_Q1 and CLK_QB1. Specific implementation examples of the first and second boosting buffers 420 and 430 will be described below with reference to FIG. 6.

In at least one example embodiment, the conversion circuit CCKT may receive the boosted first clock pair CLK_I2 and CLK_IB2 and the boosted second clock pair CLK_Q2 and CLK_QB2 from the boosting circuit BCKT, and may perform a conversion operation on the boosted first clock pair CLK_I2 and CLK_IB2 and the boosted second clock pair CLK_Q2 and CLK_QB2 from the CML level to the CMOS level, but is not limited thereto.

In at least one example embodiment, the first CML2CMOS conversion circuit 440 may receive the boosted first clock pair CLK_I2 and CLK_IB2 from the first boosting buffer 420, may perform the conversion operation on the boosted first clock pair CLK_I2 and CLK_IB2 from the CML level to the CMOS level, and may output a converted first clock pair CLK_I3 and CLK_IB3, but is not limited thereto. In at least one example embodiment, the second CML2CMOS conversion circuit 450 may receive the boosted second clock pair CLK_Q2 and CLK_QB2 from the second boosting buffer 430, may perform the conversion operation on the boosted second clock pair CLK_Q2 and CLK_QB2 from the CML level to the CMOS level, and may output a converted second clock pair CLK_Q3 and CLK_QB3, etc., but is not limited thereto. Specific implementation examples of the first and second CML2CMOS conversion circuits 440 and 450 will be described below with reference to FIG. 7.

However, in FIG. 5, the boosting circuit BCKT is illustrated as including two independent boosting buffers 420 and 430, but is not limited thereto, and the boosting buffers 420 and 430 may be integrated into one circuit. Furthermore, the boosting circuit BCKT may include more or fewer boosting buffers according to the type and/or number of clock pairs output from the I-Q merged phase interpolator 410, etc.

In addition, in FIG. 5, the conversion circuit CCKT is illustrated as including two independent CML2CMOS conversion circuits 440 and 450, but is not limited thereto, and the CML2CMOS conversion circuits 440 and 450 may be integrated into one circuit. Furthermore, the conversion circuit CCKT may include more or fewer CML2CMOS conversion circuits according to the type and/or number of clock pairs output from the I-Q merged phase interpolator 410, etc.

Figure 6:
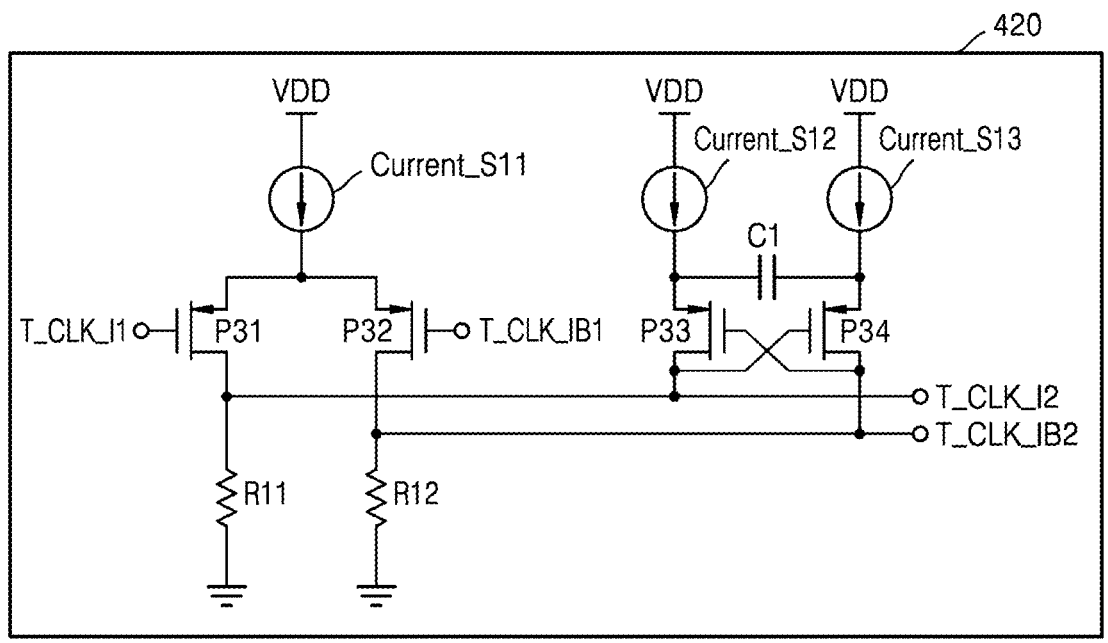
FIG. 6 is a circuit diagram illustrating a first boosting buffer of FIG. 5 according to some example embodiments.

FIG. 6 is a circuit diagram illustrating the first boosting buffer 420 of FIG. 5 according to some example embodiments. The implementation example of the first boosting buffer 420 of FIG. 6 may also be applied to the second boosting buffer 430 of FIG. 5, but the example embodiments are not limited thereto, and in some example embodiments, the boosting buffer may have different architectures.

Referring to FIG. 6, the first boosting buffer 420 may include a plurality of current sources (e.g., current generators, etc.), such as first to third current sources Current_S11, Current_S12, and Current_S13, at least one capacitor C1, a plurality of transistors, e.g., twenty-first to twenty-fourth pMOS transistors P31 to P34, and/or, etc., a plurality of resistors, e.g., first and second 2 resistors R11 and R12, but the example embodiments are not limited thereto.

In at least one example embodiment, the first to third current sources Current_S11, Current_S12, and Current_S13 may be coupled in parallel with each other to draw a certain and/or desired current from the supply voltage VDD. A source terminal of the twenty-first pMOS transistor P31 and a source terminal of the twenty-second pMOS transistor P32 may be coupled to the first current source Current_S11, a drain terminal of the twenty-first pMOS transistor P31 may be coupled to one end (e.g., first end) of the first resistor R11, and a drain terminal of the twenty-second pMOS transistor P32 may be coupled to the other end (e.g., second end) of the second resistor R12. A gate terminal of the twenty-first pMOS transistor P31 may receive a first I clock through the fifth terminal T_CLK_I1, and a gate terminal of the twenty-second pMOS transistor P32 may receive a first inverted I clock through the sixth terminal T_CLK_IB1. The other end (e.g., second end) of the first resistor R11 and the other end (e.g., second end) of the second resistor R12 may be grounded, respectively. In other words, the twenty-first pMOS transistor P31 and the twenty-second pMOS transistor P32 may be wired in parallel, etc. One end (e.g., first end) and the other end (e.g., second end) of the first capacitor C1 may be coupled to the second current source Current_S12 and the third current source Current_S13, respectively. A source terminal of the twenty-third pMOS transistor P33 may be coupled to the second current source Current_S12 and one end (e.g., first end) of the first capacitor C1, and a source terminal of the twenty-fourth pMOS transistor P34 may be coupled to the third current source Current_S13 and the other end (e.g., second end) of the capacitor C1. A drain terminal of the twenty-third pMOS transistor P33 may be coupled to a gate terminal of the twenty-fourth pMOS transistor P34, and a drain terminal of the twenty-fourth pMOS transistor P34 may be coupled to a gate terminal of the twenty-third pMOS transistor P33. In addition, the seventh terminal T_CLK_I2 outputting a second I clock may be coupled to the drain terminal of the twenty-first pMOS transistor P31 and the drain terminal of the twenty-third pMOS transistor P33, and the eighth terminal T_CLK_IB2 outputting a second inverted I clock may be coupled to the drain terminal of the twenty-second pMOS transistor P32 and the drain terminal of the twenty-fourth pMOS transistor P34. In at least one example embodiment, the second I clock may correspond to a boosted first I clock, and the second inverted I clock may correspond to a boosted first inverted I clock.

In at least one example embodiment, the connection configuration of the second current source Current_S12, the third current source Current_S13, the first capacitor C1, the twenty-third pMOS transistor P33, and the twenty-fourth pMOS transistor P34 may provide an active negative feedback to each of the fifth and sixth terminals T_CLK_I2 and T_CLK_IB2, but is not limited thereto.

In at least one example embodiment, the first boosting buffer 420 may boost (e.g., amplify) components of the first I clock CLK_I1 and the first inverted I clock CLK_IB1 in a target frequency band (e.g., desired frequency band), and further reduce (e.g., decrease and/or filter, etc.) components of a low frequency band. In some example embodiments, the amplification gain and target frequency band of the first boosting buffer 420 may be determined by a capacitance level of the first capacitor C1 and characteristics of at least one of the twenty-first to twenty-fourth pMOS transistors P31 to P34, etc.

Figure 7A:
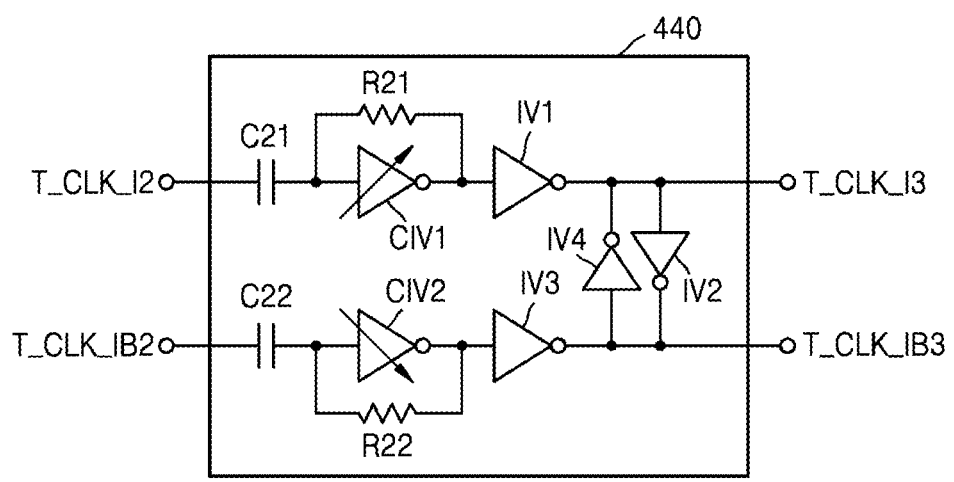
FIGS. 7A and 7B are circuit diagrams illustrating first and second current mode logic to complementary metal oxide semiconductor (CML2CMOS) conversion circuits of FIG. 5 according to some example embodiments.
Figure 7B:
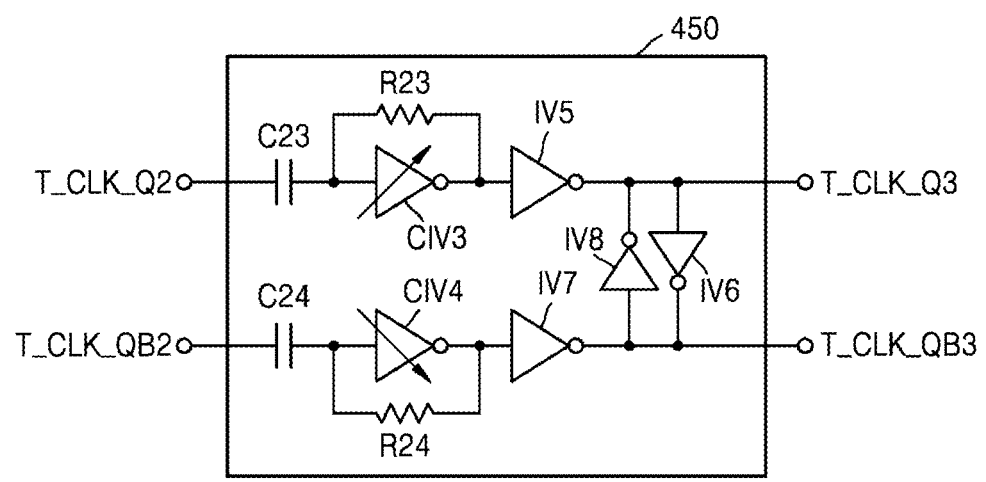

FIGS. 7A and 7B are circuit diagrams illustrating the first and second CML2CMOS conversion circuits 440 and 450 of FIG. 5 according to some example embodiments.

Referring to FIG. 7A, the first CML2CMOS conversion circuit 440 may include a plurality of capacitors, e.g., a second capacitor C21 and a third capacitor C22, a plurality of variable inverters, e.g., a first variable inverter CIV1 and a second variable inverter CIV2, a plurality of resistors, e.g., a third resistor R21 and a fourth resistor R22, and a plurality of inverters, e.g., a first to fourth inverters IV1 to IV4, etc., but is not limited thereto.

One end (e.g., a first end) of the second capacitor C21 may be coupled to the ninth terminal T_CLK_I2 receiving the second I clock, and the other end (e.g., a second end) of the second capacitor C21 may be coupled to the input terminal of the first variable inverter CIV1. The first variable inverter CIV1 may be coupled in parallel with the third resistor R21, and an output terminal of the first variable inverter CIV1 may be coupled to an input terminal of the first inverter IV1. The output terminal of the first inverter IV1 may be coupled to the input terminal of the second inverter IV2, the output terminal of the fourth inverter IV4, and the tenth terminal T_CLK_I3 outputting the third I clock.

One end (e.g., a first end) of the third capacitor C22 may be coupled to the eleventh terminal T_CLK_IB2 receiving the second inverted I clock, and the other end (e.g., a second end) of the third capacitor C22 may be coupled to the input terminal of the second variable inverter CIV2. The second variable inverter CIV2 may be coupled in parallel with the fourth resistor R22, and an output terminal of the second variable inverter CIV2 may be coupled to an input terminal of the third inverter IV3. The output terminal of the third inverter IV3 may be coupled to the output terminal of the second inverter IV2, the input terminal of the fourth inverter IV4, and the twelfth terminal T_CLK_IB3 outputting the third inverted I clock. In at least one example embodiment, the third I clock may correspond to the CML2CMOS converted second I clock, and the third inverted I clock may correspond to the CML2CMOS converted second inverted I clock, but are not limited thereto.

In at least one example embodiment, the first CML2CMOS conversion circuit 440 may couple alternating current (AC) components of the second I clock and the second inverted I clock through the second capacitor C21 and the third capacitor C22. Thereafter, the first CML2CMOS conversion circuit 440 may provide feedback to, for example, the first variable inverter CIV1 and the second variable inverter CIV2 through the third resistor R21 and the fourth resistor R22, respectively, and generate the third I clock and the third inverted I clock by modifying a common mode voltage and/or a duty cycle of each of the coupled second I clock and the coupled second inverted I clock through the second inverter IV2 and the fourth inverter IV4 which are cross coupled to each other, but the example embodiments are not limited thereto.

Referring to FIG. 7B, the second CML2CMOS conversion circuit 450 may include a plurality of capacitors, e.g., a fourth capacitor C23 and a fifth capacitor C24, a plurality of variable inverters, e.g., a third variable inverter CIV3 and a fourth variable inverter CIV4, a plurality of resistors, e.g., a fifth resistor R23 and a sixth resistor R24, and a plurality of inverters, e.g., a fifth to eighth inverters IV5 to IV8, but the example embodiments are not limited thereto.

One end (e.g., a first end) of the fourth capacitor C23 may be coupled to the thirteenth terminal T_CLK_Q2 receiving the second Q clock, and the other end (e.g., a second end) of the fourth capacitor C23 may be coupled to the input terminal of the third variable inverter CIV3. The third variable inverter CIV3 may be coupled in parallel with the fifth resistor R23, and an output terminal of the third variable inverter CIV3 may be coupled to an input terminal of the fifth inverter IV5. The output terminal of the fifth inverter IV5 may be coupled to an input terminal of the sixth inverter IV6, an output terminal of the eighth inverter IV8, and the fourteenth terminal T_CLK_Q3 outputting the third Q clock, but the example embodiments are not limited thereto.

One end (e.g., a first end) of the fifth capacitor C24 may be coupled to the fifteenth terminal T_CLK_QB2 receiving the second inverted Q clock, and the other end (e.g., a second end) of the fifth capacitor C24 may be coupled to the input terminal of the fourth variable inverter CIV4. The fourth variable inverter CIV4 may be coupled in parallel with the sixth resistor R24, and the output terminal of the fourth variable inverter CIV4 may be coupled to the input terminal of the seventh inverter IV7. The output terminal of the seventh inverter IV7 may be coupled to the output terminal of the sixth inverter IV6, the input terminal of the eighth inverter IV8, and the sixteenth terminal T_CLK_QB3 outputting the third inverted Q clock, but the example embodiments are not limited thereto. In at least one example embodiment, the third Q clock may correspond to the CML2CMOS converted second Q clock, and the third inverted Q clock may correspond to the CML2CMOS converted second inverted Q clock, but the example embodiments are not limited thereto.

In at least one example embodiment, the second CML2CMOS conversion circuit 450 may couple AC components of the second Q clock and the second inverted Q clock through the fourth capacitor C23 and the fifth capacitor C24. Thereafter, the second CML2CMOS conversion circuit 450 may provide feedback to the third variable inverter CIV3 and the fourth variable inverter CIV4 through the fifth resistor R23 and the sixth resistor R24, respectively, and generate the third Q clock and the third inverted Q clock by modifying a common mode voltage and/or a duty cycle of each of the coupled second Q clock and the coupled second inverted Q clock through the sixth inverter IV6 and the eighth inverter IV8 which are cross coupled to each other, but the example embodiments are not limited thereto.

In at least one example embodiment, the intensity of the first and second variable inverters CIV1 and CIV2 (e.g., variable inverter circuitry, an inverted variable gain amplifier, etc.) and the intensity of the third and fourth variable inverters CIV3 and CIV4 may be previously set (and/or configured, etc.) so that the phase difference between the third I clock output from the first CML2CMOS conversion circuit 440 and the third Q clock output from the second CML2CMOS conversion circuit 450 and the phase difference between the third inverted I clock output from the first CML2CMOS conversion circuit 440 and the third inverted Q clock output from the second CML2CMOS conversion circuit 450 have respective target values (e.g., desired values). In at least one example embodiment, the intensity of a variable inverter refers to a driving capability of the variable inverter with respect to a signal, and a high intensity may correspond to a good driving capability. In summary, for an effective sampling operation on input data of the clock data recovery circuit, there may be a case where a phase difference between the I clock and the Q clock used for the sampling operation needs to be less than or greater than 90 degrees depending on a structure, an operating environment of the clock data recovery circuit, other design considerations, and/or other user considerations, etc. Accordingly, the intensity of the first and second variable inverters CIV1 and CIV2 and the intensity of the third and fourth variable inverters CIV3 and CIV4 may be set differently, so that a phase difference between the third I clock and the third Q clock and a phase difference between the third inverted I clock and the third inverted Q clock may have a target value for a desired, improved, and/or optimal sampling operation. That is, the phase of the third I clock and the phase of the third inverted I clock may be adjusted according to the intensity of the first and second variable inverters CIV1 and CIV2, and the phase of the third Q clock and the phase of the third inverted Q clock may be adjusted according to the intensity of the third and fourth variable inverters CIV3 and CIV4, etc., but the example embodiments are not limited thereto. In some example embodiments, the intensity of the first and second variable inverters CIV1 and CIV2 and the intensity of the third and fourth variable inverters CIV3 and CIV4 may be adjusted during a training mode of the clock data recovery circuit and/or may be configured by the manufacturer and/or user, etc., but the example embodiments are not limited thereto.

However, the example embodiments shown in FIGS. 7A and 7B are merely examples, and the inventive concepts are not limited thereto, and any one of the various example embodiments enabling conversion from the CML level to the CMOS level may be applied to the first and second CML2CMOS conversion circuits 440 and 450, etc.

Figure 8:
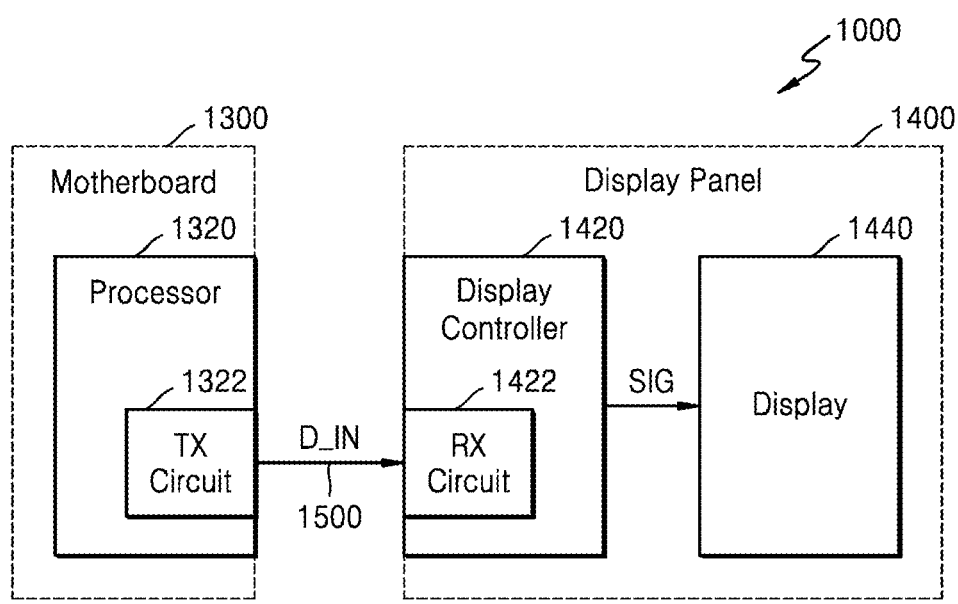
FIG. 8 is a block diagram illustrating an apparatus including a clock data recovery circuit according to at least one example embodiment of the inventive concepts.

FIG. 8 is a block diagram illustrating an apparatus 1000 including a clock data recovery circuit according to at least one example embodiment of the inventive concepts.

The clock data recovery circuit according to at least one example embodiment of the inventive concepts may be included in a receiving circuit 1422 (e.g., a receiver, receiving circuitry, a transceiver circuit, etc.). The apparatus 1000 may be a computing system including a display panel 1400, and may be, as a non-limiting example, a stationary system such as a desktop computer, a server, a TV, an electronic billboard, etc., and/or may be a mobile system such as a laptop computer, a mobile phone, a tablet PC, and/or a wearable device, etc., but the example embodiments are not limited thereto. As shown in FIG. 8, the apparatus 1000 may include a motherboard 1300 and a display panel 1400, etc., and input data D_IN may be transmitted from the motherboard 1300 to the display panel 1400 through a data line 1500, but the example embodiments are not limited thereto.

The motherboard 1300 may include at least one processor 1320 (e.g., processing circuitry, etc.), and the processor 1320 may include a transmitting circuit 1322, but is not limited thereto. The processing circuitry may include the processor 1320 and/or the transmitting circuit 1233, and may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processor 320 may be a video graphics processor, such as a graphics processing unit (GPU), etc. The processor 1320 may generate image data corresponding to an image output through a display 1440 included in the display panel 1400, and the image data may be provided to the transmitting circuit 1322. In some example embodiments, the at least one processor 1320 may be a plurality of processors, and/or may include a plurality of processing cores, etc.

The transmitting circuit 1322 may output the input data D_IN to the receiving circuit 1422 for a clock data restoration operation of the receiving circuit 1422. The display panel 1400 may include a display controller 1420 and the display 1440, etc., but is not limited thereto. The display controller 1420 may receive the input data D_IN from the motherboard 1300, and may perform the clock data restoration operation using the input data D_IN, etc. In some example embodiments, the display controller 1420 may provide a display signal SIG for controlling pixels included in the display 1440 and may be referred to as a display driver IC (DDI), etc.

The display controller 1420 may include the receiving circuit 1422, and the receiving circuit 1422 may receive the input data D_IN. The receiving circuit 1422 may include a clock data recovery circuit according to at least one example embodiment of the inventive concepts, and may generate recovery clocks and recovery data from the input data D_IN. The clock data recovery circuit included in the receiving circuit 1422 may include an I-Q merged phase interpolator implemented to decrease, reduce, and/or minimize distortion between the recovery clocks.

The display 1440 may include, as a non-limiting example, any type of display such as a liquid crystal display (LCD), a light emitting diode (LED), an electroluminescent display (ELD), a cathode ray tube (CRT), a plasma display panel (PDP), and/or a liquid crystal on silicon (LCoS), etc., but is not limited thereto. Also, although the apparatus 1000 is illustrated as including one display panel 1400 in FIG. 8, in some example embodiments, the apparatus 1000 may include two or more display panels, that is, two or more displays, etc.

Figure 9:
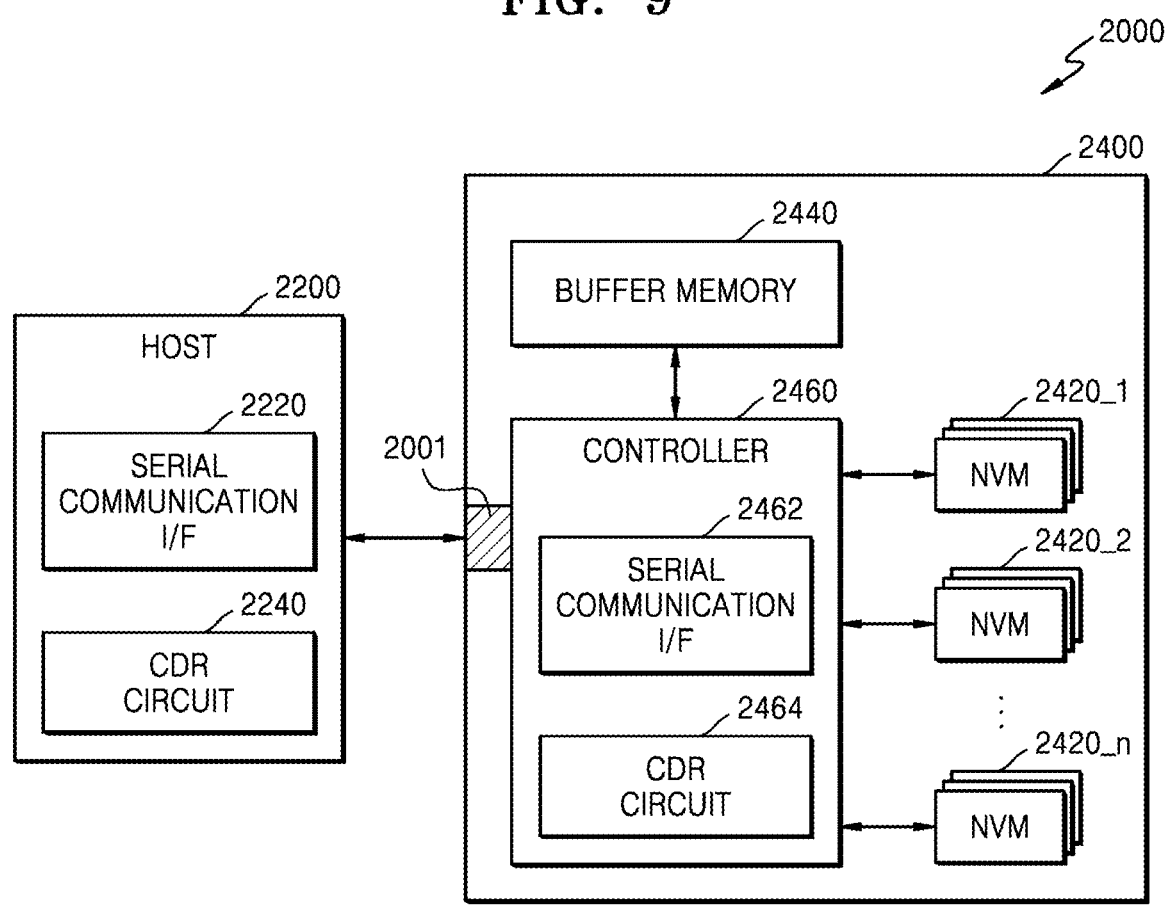
FIG. 9 is a block diagram illustrating a system including clock data recovery circuits according to at least one example embodiment of the inventive concepts.

FIG. 9 is a block diagram illustrating a system 2000 including clock data recovery circuits 2240 and 2464 according to at least one example embodiment of the inventive concepts.

Referring to FIG. 9, the system 2000 may include a host 2200 (e.g., a host device, etc.) and/or a storage device 2400, etc., but is not limited thereto, and for example, may include a greater or lesser number of constituent components. The storage device 2400 may be referred to as a memory system or a storage system, and may include a signal connector 2001, a plurality of nonvolatile memories 2420_1 to 2420_n, a buffer memory 2440, and/or a controller 2460, etc. For example, the controller 2460 may be referred to as a memory controller or a storage controller.

The storage device 2400 may transmit and/or receive signals to and/or from a host 2200 through the signal connector 2001. The host 2200 and the storage device 2400 may communicate through an electrical signal and/or an optical signal, and as a non-limiting example, may communicate through UFS (Universal Flash Storage), SATA (Serial Advanced Technology Attachment), SATAe (SATA express), SCSI (Small Computer Small Interface), SAS (Serial Attached SCSI), PCIe (Peripheral Component Interconnect express), NVMe (Non-Volatile Memory Express), AHCI (Advanced Host Controller Interface), etc., or a combination thereof.

The controller 2460 may control the plurality of nonvolatile memories 2420_1 to 2420_n in response to a signal received from the host 2200. The controller 2460 may include a serial communication interface circuit 2462 for transmitting and receiving data, and a clock data recovery circuit 2464 to which at least one example embodiment of the inventive concepts are applied so as to recover a clock and data of a received serial data signal, etc. The serial communication interface circuit 2462 may provide a communication interface, such as UFS, SATA, SATAe, SCSI, SAS, PCIe, NVMe, AHCI, etc. The buffer memory 2440 may operate as a buffer memory of the storage device 2400, but is not limited thereto. Meanwhile, the host 2200 may also include a serial communication interface circuit 2220 for data transmission and/or reception and a clock data recovery circuit 2240 to which at least one example embodiment of the inventive concepts is applied.

Each of the nonvolatile memories 2420_1 to 2420_n may include a memory cell array, the memory cell array may include memory blocks, each of the memory blocks may be divided into pages, and each page may include nonvolatile memory cells, for example, at least one NAND flash memory cell, but the example embodiments are not limited thereto.

While various example embodiments of the inventive concepts have been particularly shown and described with reference to the example embodiments thereof, it will be understood that various changes in form and details may be made therein without departing from the spirit and scope of the following claims.

What is claimed is:

1. A clock data recovery circuit comprising:
an inphase-quadrature (I-Q) merged phase interpolator circuit, the I-Q merged phase interpolator circuit including an I-phase mixer and a Q-phase mixer, the I-Q merged phase interpolator circuit configured to generate a first clock pair and a second clock pair from a plurality of reference clock signals, the plurality of reference clock signals having different phases, the first clock pair comprising an I clock signal and an inverted I clock signal, and the second clock pair comprising a Q clock signal and an inverted Q clock signal;
a sampler circuit configured to sample input data based on the first clock pair and the second clock pair; and
a control circuit configured to control phases of the first clock pair and the second clock pair, the controlling including providing a control signal to the I-Q merged phase interpolator circuit based on a sampling result of the sampler circuit,
wherein the I-Q merged phase interpolator circuit is further configured to,
share analog inputs between the I-phase mixer and the Q-phase mixer based on the control signal, the sharing the analog inputs including outputting a current as the analog inputs through at least one activated path among a plurality of paths based on the control signal.

2. The clock data recovery circuit of claim 1, wherein the I-Q merged phase interpolator circuit is further configured to:
generate a phase interpolation code from the control signal; and
generate the analog inputs based on the phase interpolation code.

3. The clock data recovery circuit of claim 2, wherein the I-Q merged phase interpolator circuit is further configured to:
output the current as the analog inputs through the at least one activated path in response to received bits in the phase interpolation code.

4. The clock data recovery circuit of claim 1, wherein I-Q merged phase interpolator circuit is further configured to:
  output the analog inputs as the first clock pair or the second clock pair in response to the plurality of reference clock signals.

5. The clock data recovery circuit of claim 1, further comprising:
  a boosting circuit configured to receive the first clock pair and the second clock pair from the I-Q merged phase interpolator circuit, and to boost components of the first clock pair and the second clock pair in a target frequency band.

6. The clock data recovery circuit of claim 5, wherein the boosting circuit is further configured to:
  boost components of the I clock signal and the inverted I clock signal in the target frequency band; and
  boost components of the Q clock signal and the inverted Q clock signal in the target frequency band.

7. The clock data recovery circuit of claim 5, wherein the boosting circuit comprises:
  first and second resistors each having a first end grounded and configured to respectively output the boosted I clock signal and the boosted inverted I clock signal through a second end;
  first to third current sources coupled in parallel with each other;
  a first p-channel metal-oxide-semiconductor (pMOS) transistor coupled to the first current source through a first source terminal and coupled to the second end of the first resistor through a first drain terminal, the first pMOS transistor configured to receive the I clock signal through a first gate terminal;
  a second pMOS transistor coupled to the first current source through a second source terminal and coupled to the second end of the second resistor through a second drain terminal, configured to receive the inverted I clock signal through a second gate terminal;
  a third pMOS transistor coupled to the second current source through a third source terminal and coupled to the second end of the first resistor through a third drain terminal;
  a fourth pMOS transistor coupled to the third current source through a fourth source terminal and coupled to the second end of the second resistor through a fourth drain terminal; and
  a capacitor coupled between the third source terminal and the fourth source terminal,
  wherein a third gate terminal of the third pMOS transistor is coupled to the fourth drain terminal, and a fourth gate terminal of the fourth pMOS transistor is coupled to the third drain terminal.

8. The clock data recovery circuit of claim 5, further comprising:
  a conversion circuit configured to receive the boosted first clock pair and the boosted second clock pair from the boosting circuit, and perform current mode logic to complementary metal oxide semiconductor (CML2CMOS) conversion on the boosted first clock pair and the boosted second clock pair.

9. The clock data recovery circuit of claim 8, wherein the conversion circuit is further configured to:
  perform CML2CMOS conversion on the boosted I clock signal and the boosted inverted I clock signal; and
  perform CML2CMOS conversion on the boosted Q clock signal and the boosted inverted Q clock signal.

10. The clock data recovery circuit of claim 9, wherein the conversion circuit is further configured to:
  adjust a phase difference between the converted I clock signal and the converted inverted I clock signal; and
  adjust a phase difference between the converted Q clock signal and the converted inverted Q clock signal.

* * * * *